(12) United States Patent
Yamamoto et al.

(10) Patent No.: US 11,736,060 B2
(45) Date of Patent: Aug. 22, 2023

(54) PHOTOVOLTAIC APPARATUS AND PHOTOVOLTAIC APPARATUS CONTROL METHOD

(71) Applicant: SUMITOMO ELECTRIC INDUSTRIES, LTD., Osaka (JP)

(72) Inventors: Seiji Yamamoto, Osaka (JP); Rui Mikami, Osaka (JP); Satoshi Hatsukawa, Osaka (JP); Kenichi Hirotsu, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 8 days.

(21) Appl. No.: 16/966,618

(22) PCT Filed: Jan. 23, 2019

(86) PCT No.: PCT/JP2019/001960
§ 371 (c)(1),
(2) Date: Jul. 31, 2020

(87) PCT Pub. No.: WO2019/155877
PCT Pub. Date: Aug. 15, 2019

(65) Prior Publication Data
US 2021/0028743 A1  Jan. 28, 2021

(30) Foreign Application Priority Data

Feb. 9, 2018 (JP) .................... 2018-022286

(51) Int. Cl.
*H02S 20/32* (2014.01)
*H02S 50/00* (2014.01)
(Continued)

(52) U.S. Cl.
CPC .......... *H02S 20/32* (2014.12); *G05D 3/105* (2013.01); *H02S 50/00* (2013.01)

(58) Field of Classification Search
CPC .......... H02S 20/32; H02S 50/00; H02S 50/10; G05D 3/105; Y02E 10/52; H01L 31/0543
See application file for complete search history.

(56) References Cited

U.S. PATENT DOCUMENTS

2013/0335861 A1*  12/2013  Laschinski ........... H02H 1/0015
                                                              361/2
2015/0013751 A1    1/2015  Ortega Linares et al.
(Continued)

FOREIGN PATENT DOCUMENTS

CA       2632853  A1 *  5/2008
JP    2000-196127  A    7/2000
(Continued)

OTHER PUBLICATIONS

Mar. 26, 2019 International Search Report issued in International Patent Application No. PCT/JP2019/001960.

*Primary Examiner* — Niki Bakhtiari
(74) *Attorney, Agent, or Firm* — Oliff PLC

(57) ABSTRACT

A photovoltaic apparatus includes: a concentrator photovoltaic panel; a driving device configured to change an attitude of the photovoltaic panel; a current detection unit configured to detect an output current of the photovoltaic panel; and a control unit configured to cause the driving device to perform a sun-tracking shift operation when it is determined based on a detection result of the current detection unit that the photovoltaic panel is generating no power during tracking of the sun.

4 Claims, 12 Drawing Sheets

(51) Int. Cl.
*H01L 31/054* (2014.01)
*G05D 3/10* (2006.01)

(56) References Cited

U.S. PATENT DOCUMENTS

2015/0338131 A1 11/2015 Ziegler et al.
2015/0340988 A1 11/2015 Shinada et al.

FOREIGN PATENT DOCUMENTS

| JP | 2009-186094 A | 8/2009 |
| JP | 2011-029487 A | 2/2011 |
| JP | 2014-226027 A | 12/2014 |

* cited by examiner ized circuit having a function of performing a part of or all the steps or can be realized as a photovoltaic system that includes the photovoltaic apparatus.

PHOTOVOLTAIC APPARATUS AND PHOTOVOLTAIC APPARATUS CONTROL METHOD

TECHNICAL FIELD

The present invention relates to a photovoltaic apparatus and a photovoltaic apparatus control method. This application claims the priority based on Japanese Patent Application No. 2018-022286 filed on Feb. 9, 2018, and incorporates all the contents described in the above Japanese application.

BACKGROUND ART

A concentrator photovoltaic apparatus condenses sun light with a condenser lens and makes the light incident on a cell (solar cell) which is a photoelectric conversion element for power generation to generate power. Thus, for generating power with high efficiency, it is important to align an optical axis connecting the condenser lens and the cell with the incidence direction of the sun light (i.e., the angle of incidence to the condenser lens is set to 0°). Accordingly, in conventional photovoltaic apparatuses, the sun is automatically tracked so as to obtain an appropriate angle of incidence regardless of the position of the sun. In such a sun-tracking function, it is important to accurately track the sun, and hence a device for detecting a tracking shift with respect to the sun (cf. Patent Literature 1), a device for tracking the sun by correcting an installation error at the time of installing a photovoltaic apparatus (cf. Patent Literature 2), and the like have been proposed.

CITATION LIST

Patent Literature

Patent Literature 1: Japanese Unexamined Patent Publication No. 2009-186094
Patent Literature 2: Japanese Unexamined Patent Publication No. 2014-226027

SUMMARY OF INVENTION

A photovoltaic apparatus according to one aspect of the present disclosure includes: a concentrator photovoltaic panel; a driving device configured to change an attitude of the photovoltaic panel; a current detection unit configured to detect an output current of the photovoltaic panel; and a control unit configured to cause the driving device to perform a sun-tracking shift operation when it is determined based on a detection result of the current detection unit that the photovoltaic panel is generating no power during tracking of the sun.

A photovoltaic apparatus control method according to one aspect of the present disclosure includes the steps of: performing, a driving device configured to change an attitude of a concentrator photovoltaic panel, a sun-tracking operation of causing the photovoltaic panel to track the sun; detecting an output current of the photovoltaic panel during the sun-tracking operation; determining whether the photovoltaic panel is generating power based on a detection result of the output current; and performing, by the driving device, a sun-tracking shift operation when it is determined that the photovoltaic panel is generating no power.

The present disclosure can be realized not only as a photovoltaic apparatus including such a characteristic control unit and a photovoltaic apparatus control method having steps of such characteristic processes, but also as a program for causing a computer to perform the steps. In addition, the present disclosure can be realized as a semiconductor integrated circuit having a function of performing a part of or all the steps or can be realized as a photovoltaic system that includes the photovoltaic apparatus.

DESCRIPTION OF EMBODIMENTS

Figure 1:
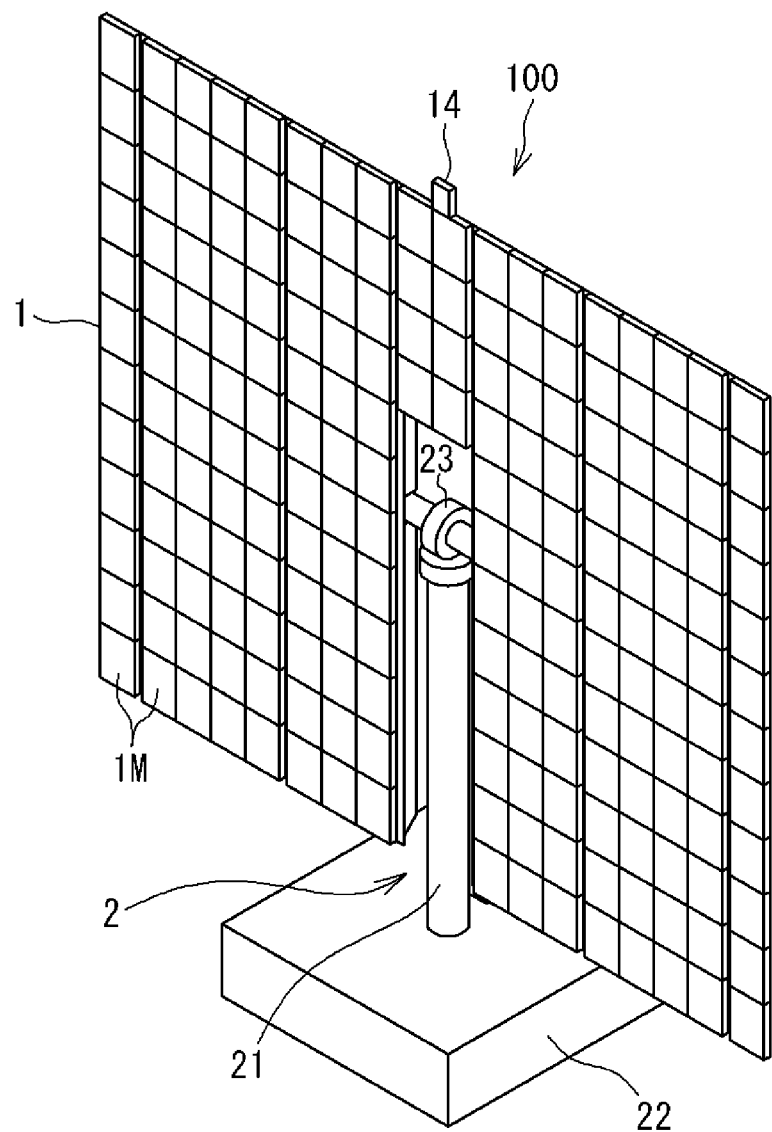
FIG. 1 is a perspective view of one concentrator photovoltaic apparatus as viewed from the light receiving surface side.

Problems to be Solved by Present Disclosure

For example, when a defect occurs in a circuit of a power generation system such as an inverter or a power conditioner, power generation is not normally performed, and a part of energy generated by light concentration becomes heat. Thus, when the tracking of the sun is continued in a situation where the power generation cannot be normally performed, there is a possibility that the cell and its peripheral circuit are damaged by the concentrated heat.

Effect of Present Disclosure

According to the present disclosure, damage to the cell and its peripheral circuit due to concentrated heat can be prevented.

Outline of Embodiment of Present Invention

Hereinafter, the outline of an embodiment of the present invention will be listed and described.
(1) A photovoltaic apparatus according to the present embodiment includes: a concentrator photovoltaic panel; a driving device configured to change an attitude of the photovoltaic panel; a current detection unit configured to detect an output current of the photovoltaic panel; and a control unit configured to cause the driving device to perform a sun-tracking shift operation when it is determined based on a detection result of the current detection unit that the photovoltaic panel is generating no power during tracking of the sun.

Thereby, when it is determined that the photovoltaic panel is generating no power, the driving device performs the sun-tracking shift operation. Hence the sun light is not converged on the cell and its peripheral circuit, and damage to the cell and its peripheral circuit due to concentrated heat can be prevented. Here, the photovoltaic panel may be a module formed by a plurality of cells being arrayed, may be a string formed by a plurality of modules being connected in series, or may be an array formed by a plurality of modules being arrayed in the shape of a single panel.

(2) The photovoltaic apparatus according to the present embodiment may further include a voltage detection unit configured to detect an output voltage of the photovoltaic panel, and the control unit may cause the driving device to perform the sun-tracking shift operation when it is determined that the photovoltaic panel is generating no power based further on a detection result of the voltage detection unit.

By using the output voltage in addition to the output current of the photovoltaic panel, for example, when the output current is 0 and the output voltage is 0, the power generating situation of the photovoltaic panel can be determined more accurately such that the occurrence of an abnormality in a power generation system can be determined.

(3) The photovoltaic apparatus according to the present embodiment may further include a solar radiation intensity detection unit configured to detect solar radiation intensity, and the control unit may cause the driving device to perform the sun-tracking shift operation when it is determined that the photovoltaic panel is generating no power based further on a detection result of the solar radiation intensity detection unit.

when it is determined that the photovoltaic panel is generating no power even though the solar radiation intensity is high enough to generate power, a lack of solar radiation is not included as a reason for not generating power, so it is assumed that there is a defect in the circuit of the power generation system, and the like. Thus, in this case, damage to the cell and its peripheral circuit can be prevented by performing the sun-tracking shift operation. Meanwhile, when the power generation is being unable to be performed due to insufficient solar radiation intensity, the sun-tracking shift operation need not be performed because the amount of light required for the power generation is not hitting the photovoltaic panel in the first place. Therefore, by considering the detection result of the solar radiation intensity detection unit in addition to the detection results of the current detection unit and the voltage detection unit, it is possible to appropriately determine whether or not the sun-tracking shift operation is necessary, and it is possible to prevent the unnecessary sun-tracking shift operation from being performed.

(4) The photovoltaic apparatus according to the present embodiment may further include a short-circuit current detection unit configured to detect a short-circuit current of the photovoltaic panel, and the control unit may cause the driving device to perform the sun-tracking shift operation when the output current is not detected and the short-circuit current is detected.

When a short-circuit current is detected, with the power generation being performed by the photovoltaic panel, it can be determined that there is no abnormality in the photovoltaic panel itself and that the solar radiation intensity with which power generation is possible is ensured. In this state, when no output current is detected, there can be an abnormality in the circuit of the power generation system except for the photovoltaic panel. When the photovoltaic panel tracks the sun in such a situation, it is conceivable that high-temperature concentrated heat is generated in the cell and its peripheral circuit, so that damage to the cell and its peripheral circuit due to the generation of concentrated heat can be prevented by causing the driving device to perform the sun-tracking shift operation.

(5) The photovoltaic apparatus according to the present embodiment may further include a switch configured to short-circuit the photovoltaic panel generation panel, and the short-circuit current detection unit may be the current detection unit.

In this case, the photovoltaic panel can be easily short-circuited by turning on the switch, and at the point when the photovoltaic panel is short-circuited, a current is detected by the current detection unit, so that the current detection unit can be caused to function as the short-circuit current detection unit. Therefore, the number of parts and the cost can be reduced.

(6) A photovoltaic apparatus control method according to the present embodiment includes the steps of: performing, a driving device configured to change an attitude of a concentrator photovoltaic panel, a sun-tracking operation of causing the photovoltaic panel to track the sun; detecting an output current of the photovoltaic panel during the sun-tracking operation; determining whether the photovoltaic panel is generating power based on a detection result of the output current; and performing, by the driving device, a sun-tracking shift operation when it is determined that the photovoltaic panel is generating no power.

Thereby, when it is determined that the photovoltaic panel is generating no power, the driving device performs the sun-tracking shift operation. Hence the sun light is not converged on the cell and its peripheral circuit, and damage to the cell and its peripheral circuit due to concentrated heat can be prevented.

Details of Embodiment of Present Invention

Hereinafter, an embodiment of the present invention is described in detail with reference to the drawings. At least some parts of the embodiment described below may be combined as desired.

<<Configuration Example of Entire Photovoltaic Apparatus>>

Figure 2:
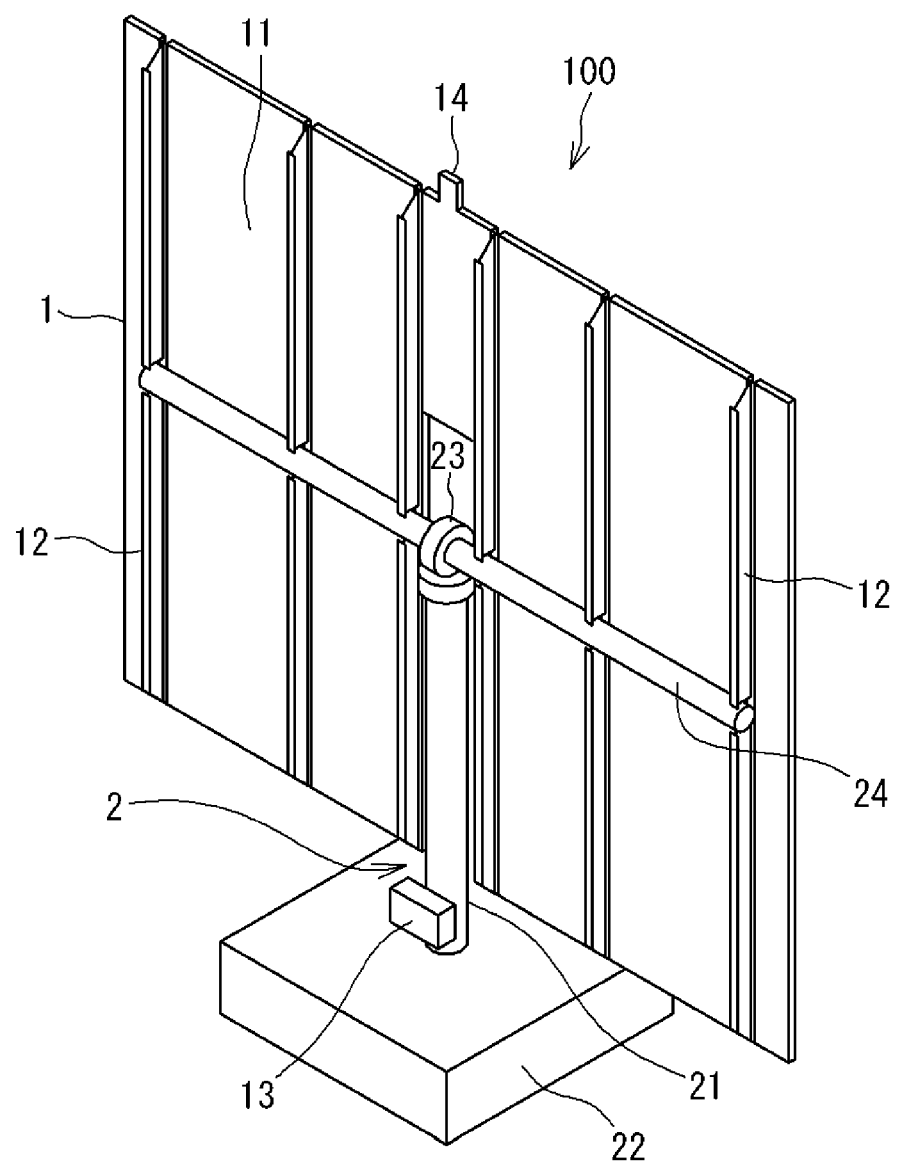
FIG. 2 is a perspective view of one concentrator photovoltaic apparatus as viewed from the rear face side.

FIG. 1 and FIG. 2 are perspective views of one concentrator photovoltaic apparatus as viewed from the light receiving surface side and the rear face side, respectively. In FIG. 1, a photovoltaic apparatus 100 includes an array 1 having a shape that is continuous at the upper side and is divided into right and left portions at the lower side; and a support device 2 for the array 1. The array 1 is formed by concentrator photovoltaic modules 1M being arrayed on a mounting base 11 (FIG. 2) at the rear face side. In the example shown in FIG. 1, the array 1 is configured as an assembly of 192 (96 (=12×8)×2) modules 1M forming right and left-wings and eight modules 1M forming a connection portion at the center, having 200 modules 1M in total.

The support device 2 includes a post 21, a base 22, a biaxial drive part 23, and a horizontal shaft 24 (FIG. 2) serving as a drive shaft. The post 21 has a lower end fixed to the base 22 and the biaxial drive part 23 at the upper end. A box 13 (FIG. 2) for electric connection and for accommodating electric circuits is provided in the vicinity of the lower end of the post 21.

In FIG. 2, the base 22 is firmly embedded in the ground so that only the upper face is visible. With the base 22 buried in the ground, the post 21 becomes vertical and the horizontal shaft 24 becomes horizontal. The biaxial drive part 23 can rotate the horizontal shaft 24 in two directions of an azimuth angle (an angle about the post 21) and an elevation angle (an angle about the horizontal axis 24). The horizontal shaft 24 is fixed so as to be orthogonal to a reinforcement material 12 that fixes and reinforces the mounting base 11. Therefore, when the horizontal shaft 24 is rotated in the azimuthal or elevation angle direction, the array 1 is also rotated in that direction.

FIG. 1 and FIG. 2 show the support device 2 that supports the array 1 with a single post 21, but the configuration of the support device 2 is not limited thereto. In short, it is possible to employ any support device that can support the array 1 so as to be movable in two axes (azimuth, elevation).

As shown in FIG. 1, the photovoltaic apparatus 100 includes a solar radiation intensity detection module 14 having a solar cell for detecting solar radiation intensity. The solar radiation intensity detection module 14 is fixed to a mounting base 11 (FIG. 2), and its light receiving surface is directed in the same direction as the light receiving surface of the module 1M. That is, when the module 1M faces the direction of the sun, the solar radiation intensity detection module 14 also faces the direction of the sun. The solar radiation intensity detection module 14 is, for example, a crystalline silicon photovoltaic module, and its maximum output power can be, for example, 5 W.

<<Configuration Example of Module>>

Figure 3:
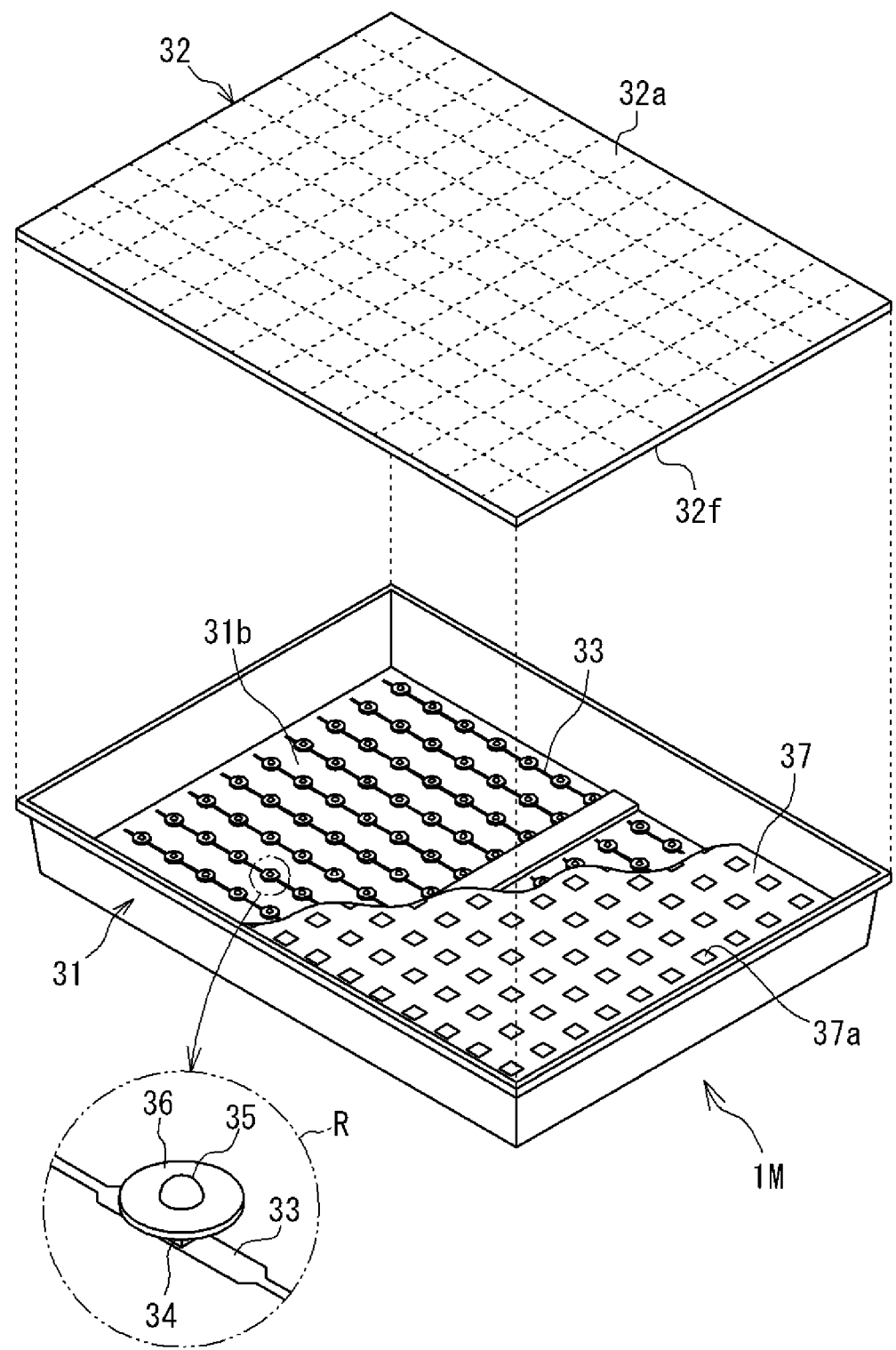
FIG. 3 is a perspective view showing an example of a configuration of a module.

FIG. 3 is a perspective view showing an example of the configuration of the module 1M. In the figure, as a physical form in appearance, the module 1M includes, for example, a housing 31 made of metal and having a rectangular flat-bottomed container shape, and a concentrating portion 32 mounted on the housing 31 like a cover. The concentrating portion 32 is formed by resin condenser lenses 32f being attached to the rear face of a single transparent glass plate 32a, for example. For example, each of square (10×14) sections that are shown is a Fresnel lens serving as a condenser lens 32f and can cause sun light to be converged at the focal point.

A flexible printed circuit 33 is disposed on a bottom face 31b of the housing 31. Cell packages 34 each holding a cell (power generating element) are mounted at predetermined positions on the flexible printed circuit 33. In the figure, the portion surrounded by "○" of a chain double-dashed line is an enlarged view of a light receiving portion R. In the light receiving portion R, a secondary lens 35 is provided on the cell package 34, and a protection plate 36 is provided around the secondary lens. The secondary lens 35 is, for example, a ball lens. The protection plate 36 is, for example, an annular-shaped metal body, and a commercially available washer can be used. When converged sun light deviates from the secondary lens 15, the protection plate 36 prevents the converged light from giving thermal damage to the periphery of the cell. Even when all the converged light enters the secondary lens 35, the protection plate 36 receives scattered light in the housing 31 and reflects the received scattered light.

The light receiving portions R are provided so as to respectively correspond to the condenser lenses 32f by the same number and at the same interval. A shielding plate 37 is provided between the light receiving portion R and the concentrating portion 32. In the shielding plate 37, at positions corresponding to the individual condenser lenses 32f, square openings 37a each having a shape similar to the outer shape of one condenser lens 32f are formed. The light converged by the condenser lens 32f passes through the opening 37a. When the incidence direction of sun light is greatly shifted from the optical axis of the light receiving portion R, the light that will otherwise be concentrated to the shifted position hits the shielding plate 37.

Figure 4:
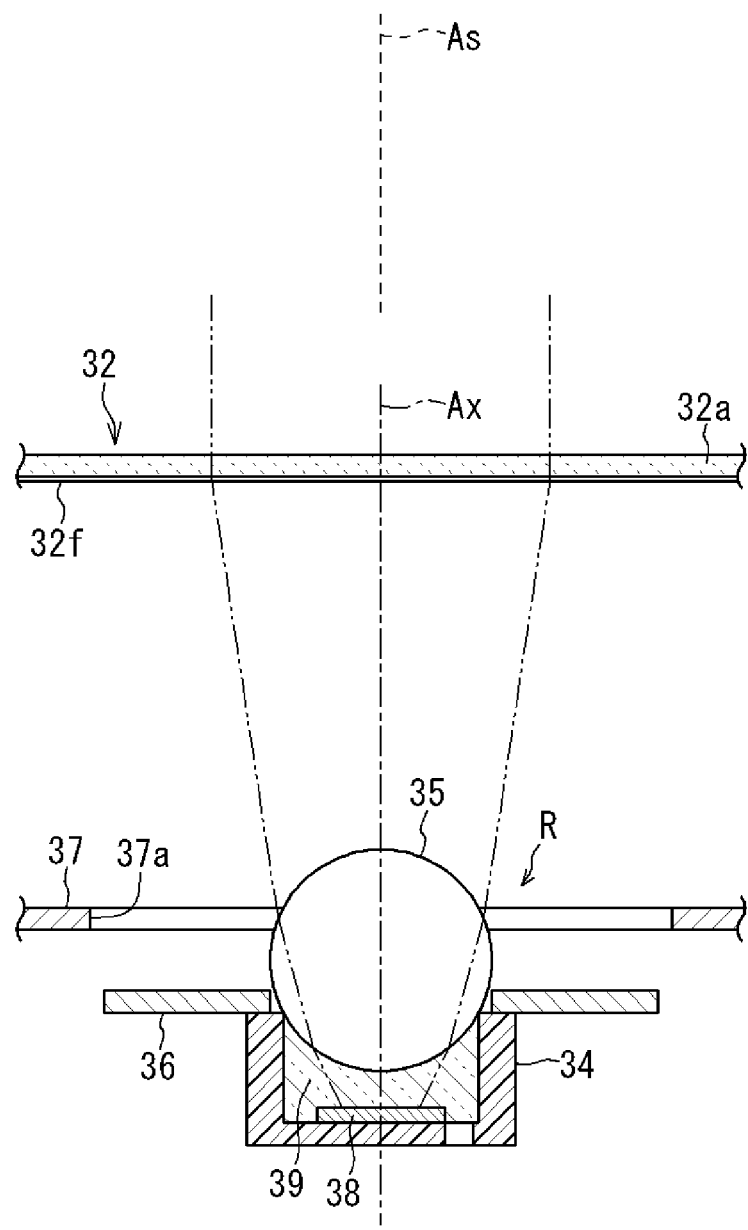
FIG. 4 is an example of a cross-sectional view representing the minimum basic configuration of an optical system and shows a state in which an optical axis connecting the condenser lens and a cell matches the incidence direction of sun light.
Figure 5:
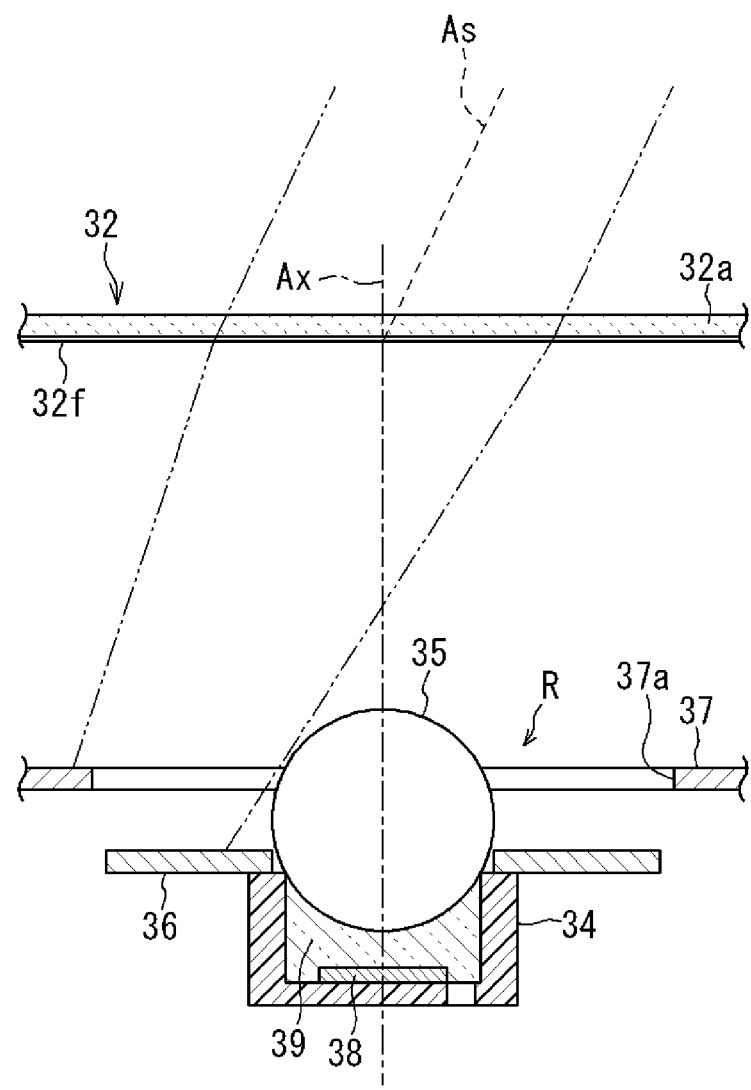
FIG. 5 is an example of a cross-sectional view representing the minimum basic configuration of the optical system and shows a state in which the optical axis connecting the condenser lens and the cell does not match the incidence direction of sun light.

FIGS. 4 and 5 are an example of a cross-sectional view showing the minimum basic configuration of an optical system. FIG. 4 shows a state in which the optical axis connecting the condenser lens and the cell matches the incidence direction of sun light, and FIG. 5 shows a state in which the optical axis connecting the condenser lens and the cell does not match the incidence direction of sun light. In FIG. 4, the incidence direction of sun light is perpendicular to the condenser lens 32f of the concentrating portion 32, and an incidence direction $A_S$ and an optical axis $A_X$ are parallel to each other (i.e., the incidence direction $A_S$ and the optical axis $A_X$ match each other). At this time, the light converged by the condenser lens 32f passes through the opening 37a of the shielding plate 37, to be incident on the secondary lens 35. The secondary lens 35 guides the incident light to a cell 38. The cell 38 is held in a cell package 34. The protection plate 36 is mounted so as to be placed on the upper end of the cell package 34. A light-transmissive resin 39 is enclosed between the secondary lens 35 and the cell 38. As shown in FIG. 4, when the optical axis $A_X$ connecting the condenser lens 32f and the cell 38 matches the incidence direction $A_S$ of sun light, all the light collected by the condenser lens 32f is guided to the cell 38. The cell 38 converts most of the received light into electric energy and outputs electric power.

As shown in FIG. 5, when the optical axis $A_X$ does not match the incidence direction $A_S$ of the sun light, the converged light by the condenser lens 32f comes off the cell 38 and hits the protection plate 36 and the shielding plate 37. Hence, in such a situation, the power generation by the cell 38 is not performed.

<<Configuration Example of Electrical Connection Relation of Power Generation System>>

Figure 6:
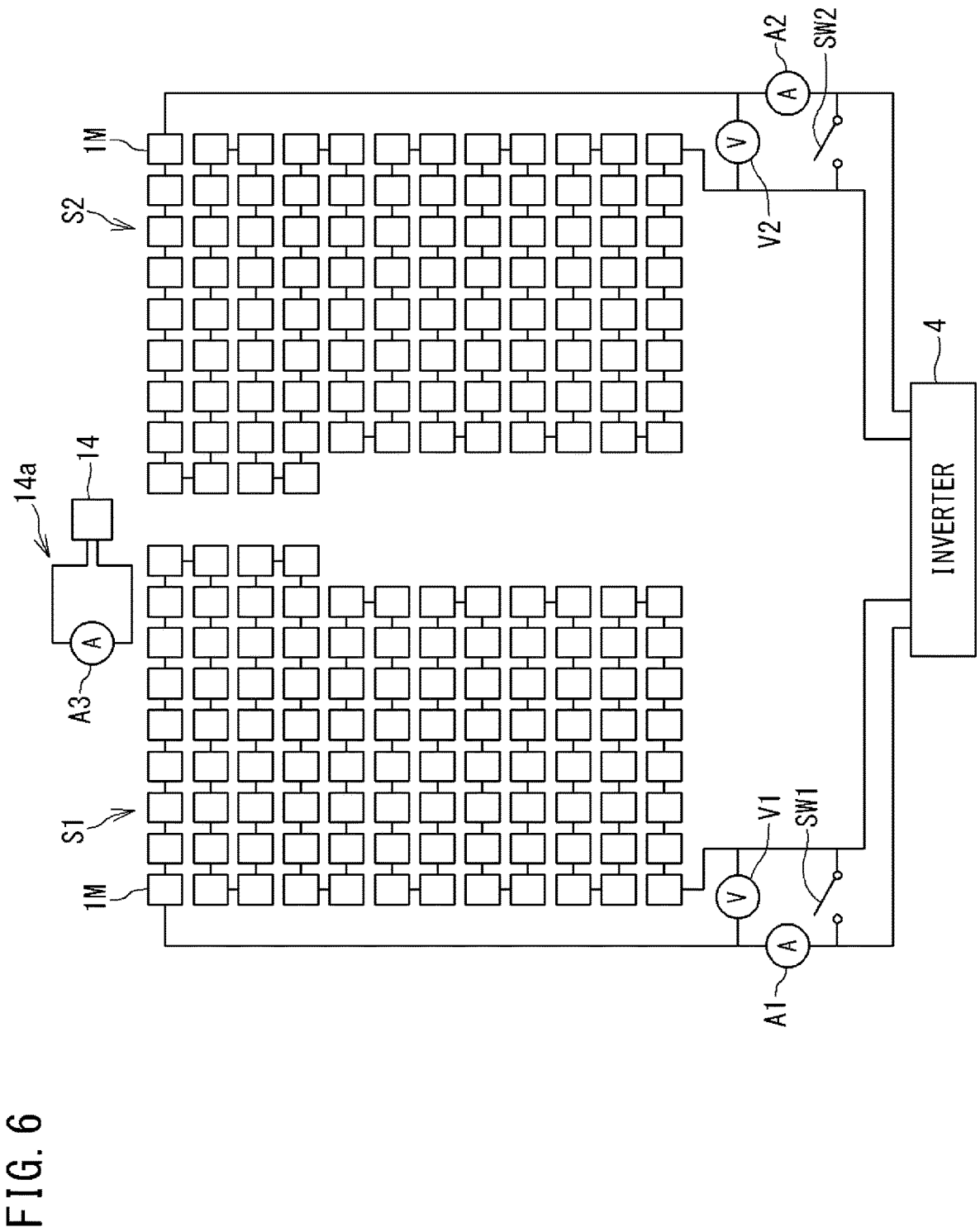
FIG. 6 is a connection diagram showing an example of an electrical connection relation of a power generation system.

FIG. 6 is a connection diagram showing an example of the electrical connection relation of the power generation system. The photovoltaic apparatus 100 has a string (photovoltaic panel) in which a plurality of modules 1M are connected in series. In the example shown in FIG. 6, the modules 1M included in the left half (left-wing) of the array 1 are connected in series to form a string S1, and the modules 1M included in the right half (right-wing) of the array 1 are connected in series to form a string S2. Current detection units A1, A2 are connected in series to the strings S1, S2, respectively, and voltage detection units V1, V2 are connected in parallel. Switches SW1, SW2 are connected in parallel to the strings S1, S2, respectively, and the strings S1, S2 can be short-circuited by turning on the switches SW1, SW2, respectively. The current detection units A1, A2 can detect output currents of the strings S1, S2 when the switches SW1, SW2 are off, and the current detection units A1, A2 can detect short-circuit currents of the strings S1, S2 when the switches SW1, SW2 are on. Therefore, it is not necessary to separately provide the current detection unit for detecting the output current and the current detection unit for detecting the short-circuit current, and the number of components and the cost can be reduced.

The switches SW1, SW2 are formed by, for example, insulated gate bipolar transistors (IGBTs). However, the switches SW1, SW2 are not limited thereto, but may be other semiconductor switches such as metal-oxide-semiconductor field-effect transistors (MOSFETs) or bipolar transistors, or may be relays.

The strings S1, S2 are each connected to an inverter (power conditioner) 4. An output (direct current) of each of the strings S1, S2 is converted into AC power by the inverter 4, and the AC power is sent to a substation (not shown). The power conditioner 4 is provided for each one or a plurality of photovoltaic apparatuses 100.

A short circuit 14a of the solar radiation intensity detection module 14 is also configured. The short circuit 14a includes a current detection unit A3 configured to detect a short-circuit current of the solar radiation intensity detection module 14. The short circuit 14a is an example of the solar radiation intensity detection unit and is not limited thereto. For example, a pyrheliometer may be provided as the solar radiation intensity detection unit.

<<Configuration Example of Control Unit of Photovoltaic Apparatus 100>>

Figure 7:
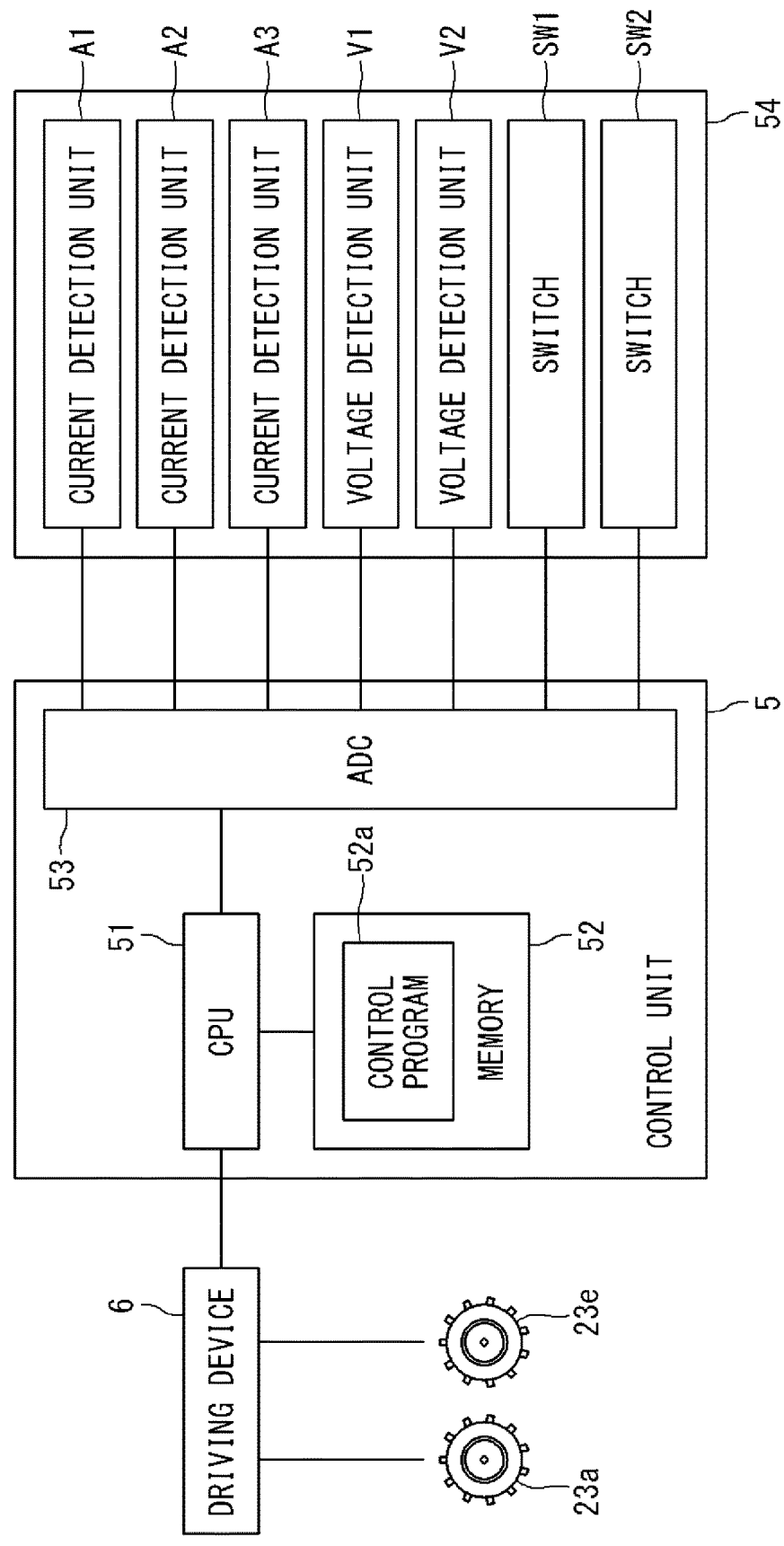
FIG. 7 is a block diagram showing an example of an outline of a control unit in the photovoltaic apparatus.

FIG. 7 is a block diagram showing an example of the outline of the control unit in the photovoltaic apparatus 100. A control unit 5 is provided in the box 13 (cf. FIG. 2), for example. The control unit 5 includes a CPU 51 and a memory 52. The memory 52 stores a control program 52a for performing an attitude control process, a power generation state determination process, and a counting process which will be described later, and the CPU 51 can execute the control program 52a stored in the memory 52. For example, a driving device 6 which drives each of a motor 23a for azimuth drive and a motor 23e for elevation drive is provided in the box 13, and the CPU 51 performs the control program 52a to output a control signal to the driving device 6, thereby controlling each of the motors 23a, 23e. Thus, by driving the motor 23a for azimuth drive and the motor 23e for elevation drive, the CPU 51 causes the driving device 6 to perform a sun-tracking operation such that the array 1 faces the sun directly from the front. Further, as will be described later, when it is estimated that power generation is being unable to be normally performed by the string S1 or S2, the CPU 51 causes the driving device 6 to perform the sun-tracking shift operation. The sun-tracking shift operation is an operation for changing the attitude of the array 1 so as to make the optical axis connecting the condenser lens and the cell different from the incidence direction of sun light. The memory 52 is provided with a tracking shift flag indicating whether or not the sun-tracking shift operation can be performed, an inverter operation wait flag for waiting for the start of the inverter 4, a tracking shift return counter for measuring the time required for the return from the sun-tracking shift operation to the sun-tracking operation, and an inverter operation wait counter for measuring the time required for the start of the inverter 4 (none is shown).

The control unit 5 is provided with an A/D converter 53, and the A/D converter 53 is connected to the CPU 51. For example, in the box 13 (cf. FIG. 2), a sensor substrate 54 is provided, and the current detection units A1 to A3, the voltage detection units V1, V2, and switches SW1, SW2 are each attached to the sensor substrate 54. The current detection units A1 to A3, the voltage detection units V1, V2, and the switches SW1, SW2 on the sensor substrate 54 are each connected to the A/D converter 53. Thereby, the CPU 51 can acquire current values detected by the current detection units A1 to A3 and voltage values detected by the voltage detection units V1, V2, and can turn on/off the switches SW1, SW2.

<<Operation Example of Photovoltaic Apparatus 100>>

Figure 8:
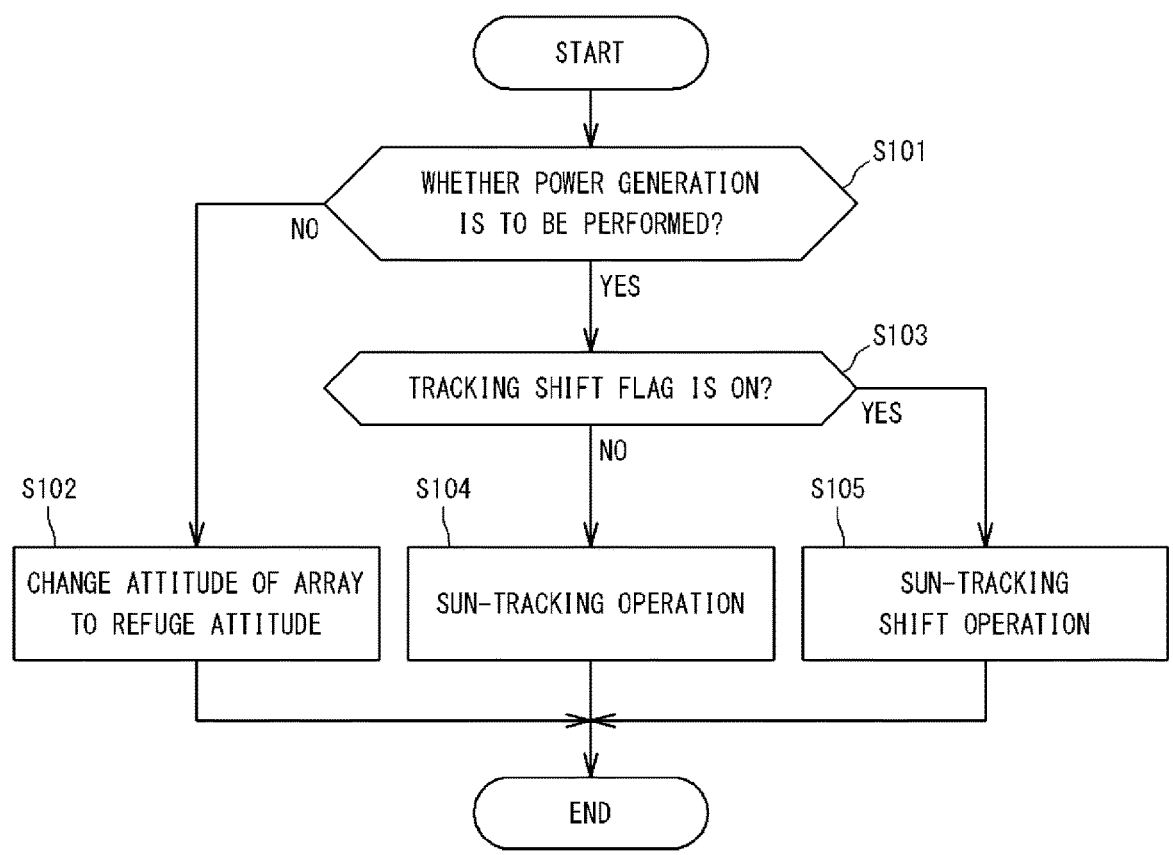
FIG. 8 is a flowchart showing an example of an attitude control process of an array.

FIG. 8 is a flowchart showing an example of an attitude control process of the array 1. The CPU 51 determines whether or not the power generation is to be performed by the photovoltaic apparatus 100 (step S101). In this process, it is determined that the power generation is to be performed in a case where it is daytime and the maintenance work is not being performed, or some other case, and it is determined that the power generation is not to be performed in a case where it is nighttime or the maintenance work is being performed, or some other case.

When it is determined that power generation is not to be performed (NO in step S101), the CPU 51 causes the array 1 to take the refuge attitude (e.g., a horizontal attitude with the light receiving surface directed downward) (step S102) and ends the process. On the other hand, when it is determined that power generation is to be performed (YES in step S101), the CPU 51 determines whether or not the tracking shift flag has been set (i.e., whether the flag has been set to on) (step S103).

When the tracking shift flag has fallen (i.e., the flag has been set to off) (NO in step S103), the CPU 51 causes the driving device 6 to perform the sun-tracking operation (step S104). By the sun-tracking operation, the array 1 takes an attitude facing the sun, and the optical axis $A_X$ connecting the condenser lens 32f and the cell 38 matches the incidence direction $A_S$ of the sun light (cf. FIG. 4). As a result, the converged light by the condenser lens 32f is guided to the cell 38, and the power generation is performed. After the sun-tracking operation has been performed, the CPU 51 ends the process.

When the tracking shift flag has been set (YES in step S103), the CPU 51 causes the driving device 6 to perform the sun-tracking shift operation (step S105). By the sun-tracking shift operation, the array 1 takes an attitude not facing the sun. For example, when the tracking shift flag has been set during the sun-tracking, the sun-tracking shift operation is performed, and the array 1 changes its attitude in the direction of at least one of the elevation angle and the azimuth angle. As a result, the array 1 takes the attitude not facing the sun, and the optical axis AX connecting the condenser lens 32f and the cell 38 comes into the state of not matching the incidence direction AS of the sun light (cf. FIG. 5). As a result, the converged light by the condenser lens 32f is not guided to the cell 38, and the power generation is not performed. After the sun-tracking shift operation is performed, the CPU 51 ends the process.

The CPU 51 repeatedly performs the attitude control process as described above at a predetermined time interval (e.g., at an interval of 1 second). Accordingly, the array 1 can take an appropriate attitude in accordance with the situation.

Figure 9:
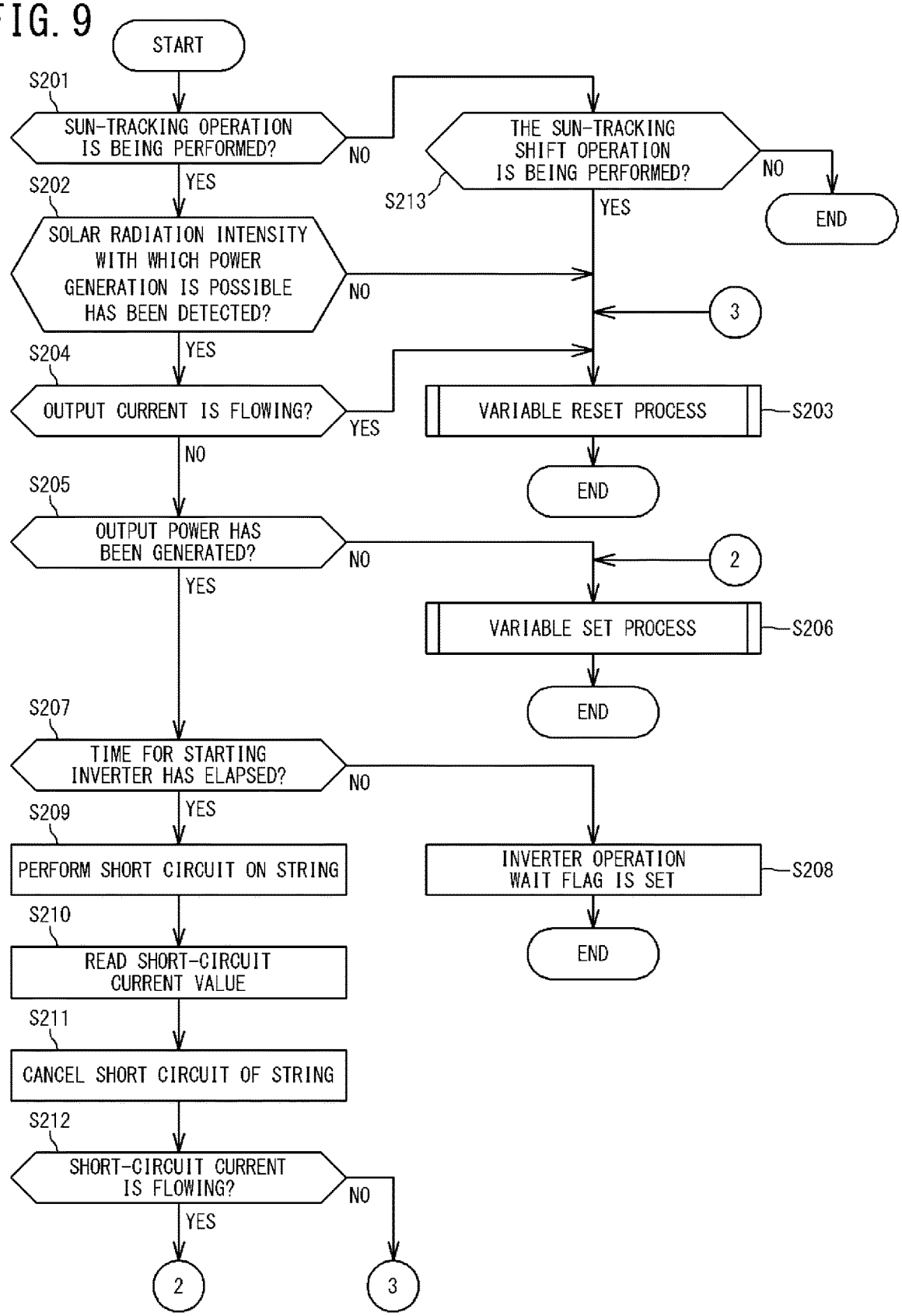
FIG. 9 is a flowchart showing an example of a power generation state determination process of a photovoltaic panel.

FIG. 9 is a flowchart showing an example of a power generation state determination process. The CPU 51 repeatedly performs such a power generation state determination process as follows at a predetermined time interval (e.g., at an interval of 1 second).

The CPU 51 determines whether or not the sun-tracking operation by the driving device 6 is being performed (step S201). When the sun-tracking operation is being performed (YES in step S201), the CPU 51 refers to a short-circuit current value of the solar radiation intensity detection module 14 which is the detection result of the current detection unit A3, and determines whether or not the solar radiation intensity with which power generation is possible has been detected (step S202). As shown in FIG. 1, the light receiving surface of the solar radiation intensity detection module 14 is made parallel to the light receiving surfaces of the other modules 1M. Therefore, when the sun-tracking operation is being performed, the light receiving surface of the solar radiation intensity detection module 14 is to face the sun, and when it is sunny, an output current (short-circuit current) of a certain level or more is to be obtained. In the process of step S202, for example, a current level corresponding to the solar radiation intensity with which the module 1M can generate power is preset as a threshold value, and when the short-circuit current value of the solar radiation intensity detection module 14 is equal to or greater than this threshold value, it can be determined that the solar radiation intensity with which power generation is possible has been detected, and when the short-circuit current is less than the threshold value, it can be determined that the solar radiation intensity with which power generation is possible has not been detected. When the pyrheliometer is provided as the solar radiation intensity detection unit, in the process of step S202, it can be determined whether or not the solar radiation intensity with which power generation is possible has been detected, depending on whether or not the output value of the pyrheliometer is equal to or greater than a constant value.

Figure 10:
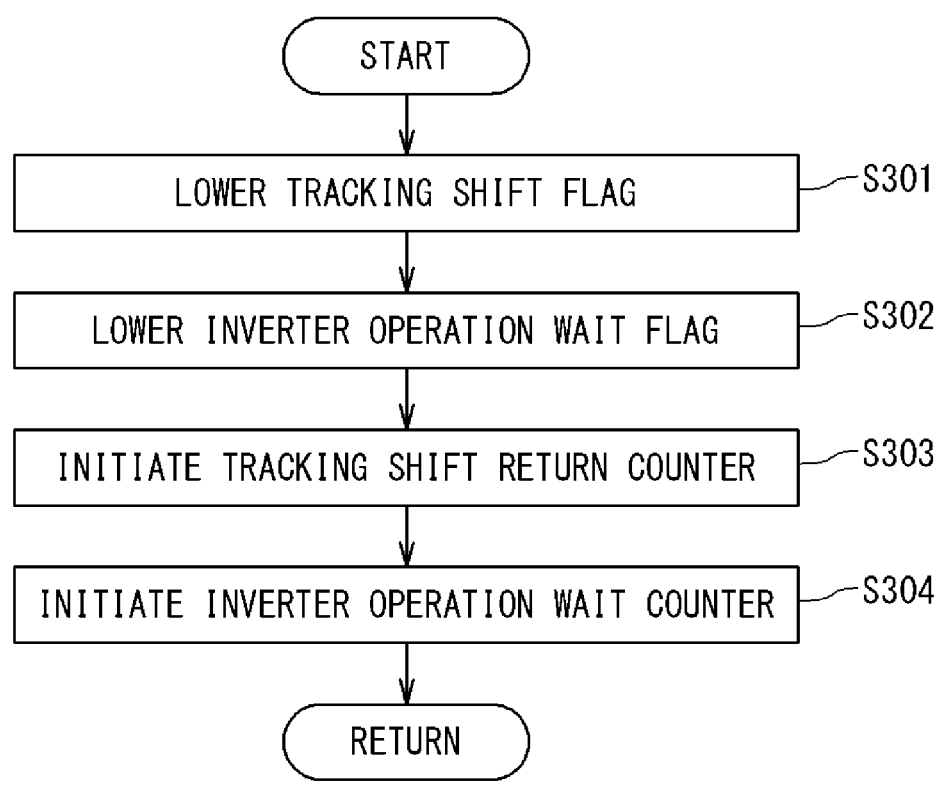
FIG. 10 is a flowchart showing an example of a variable reset process.

When the solar radiation intensity with which power generation is possible is not detected (NO in step S202), it is not necessary to perform the sun-tracking shift operation because the amount of light required for generating power is not hitting the array 1 in the first place. Accordingly, the CPU 51 performs a variable reset process for continuing the sun-tracking operation (step S203). FIG. 10 is a flowchart showing an example of a variable reset process. In the variable reset process, the CPU 51 lowers the tracking shift flag (step S301) and lowers the inverter operation wait flag (step S302). Further, the CPU 51 sets each of the tracking shift return counter and the inverter operation wait counter to an initial value of 0 (steps S303 and S304). That is the end of the variable reset process. After the variable reset process, the CPU 51 ends the power generation state determination process (cf. FIG. 9). It is thereby possible to prevent the unnecessary sun-tracking shift operation from being performed.

When the solar radiation intensity with which power generation is possible is detected (YES in step S202), the CPU 51 refers to the output currents values of the strings S1, S2 which are the detection results of the current detection units A1, A2, and determines whether or not an output current is flowing (step S204). In this process, for example, when the output current value exceeds 0, it can be determined that the output current is flowing. When the output current values of both the strings S1, S2 exceed 0, it is determined that an output current is flowing, and when one of or both the output current values are 0, it is determined that no output current is flowing. In a case where there is one photovoltaic panel (module, string, or array) as a determination target for whether or not the output current is flowing, when the output current value of the photovoltaic panel is greater than 0, it may be determined that the output current is flowing, and when the output current value is 0, it may be determined that no output current is flowing, in step S204. In a case where the number of photovoltaic panels as the determination targets is three or more, when the output current values of all the photovoltaic panels exceed 0, it may be determined that the output current is flowing, and when the output current value of at least one photovoltaic panel is 0, it may be determined that no output current is flowing.

When it is determined that the output current is flowing (YES in step S204), the power generation is being normally performed by the strings S1, S2 (i.e., the entire array 1). Thus, the sun-tracking operation may be continued, and the power generation may be performed as it is. Therefore, the CPU 51 performs the variable reset process (step S203) and ends the power generation state determination process.

On the other hand, when it is determined that no output current is flowing (NO in step S204), one of the following states is estimated.

(1) A defect in the inverter 4 (including disconnection between the inverter 4 and the sensor substrate 54)

(2) Stoppage of the inverter 4

(3) A defect in the string S1, S2 (including disconnections between the strings S1, S2 and the sensor substrate 54)

(4) A sun-tracking shift state

Then, in order to specify whether or not the state is (3) among the above, the CPU 51 refers to the output voltage values of the strings S1, S2 which are the detection results of the voltage detection units V1, V2, and determines whether or not an output voltage has been generated (step S205). In this process, for example, the one of the strings S1, S2 where it is determined in step S204 that no output current is flowing is used as the determination target, and when the output voltage value of the determination target exceeds 0, it is determined that the output voltage has been generated, and when the output voltage value of the determination target is 0, it is determined that no output voltage is being generated In a case where the number of photovoltaic panels is three or more, similarly, the one where it is determined that no output current is flowing may be used as the determination target. In a case where there is only one photovoltaic panel, the photovoltaic panel may be used as the determination target.

Figure 11:
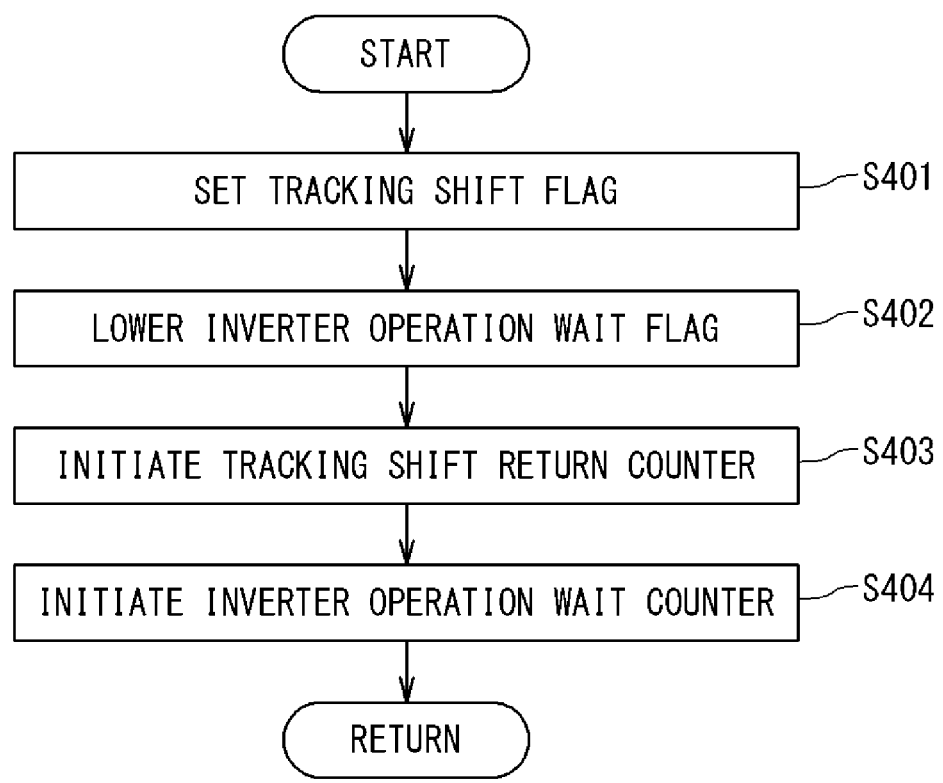
FIG. 11 is a flowchart showing an example of a variable set process.

When no output voltage is being generated (NO in step S205), it can be estimated that the state is the case (3). When the sun-tracking operation is continued in a state where the power generation is being unable to be performed due to the occurrence of a defect in the strings S1, S2, there is a possibility that concentrated heat is generated and the cell 38 and its peripheral circuits are damaged. Hence the CPU 51 performs a variable set process for the sun-tracking shift operation (step S206). FIG. 11 is a flowchart showing an example of the variable set process. In the variable set process, the CPU 51 sets the tracking shift flag (step S401) and lowers the inverter operation wait flag (step S402). Further, the CPU 51 sets each of the tracking shift return counter and the inverter operation wait counter to an initial value of 0 (Steps S403 and S404). That is the end of the variable set process. After the variable set process, the CPU 51 ends the power generation state determination process (cf. FIG. 9). Thereby, the sun-tracking shift operation is performed, and damage due to concentrated heat in the cell 38 and its peripheral circuit can be prevented.

When an output voltage is being generated (YES in step S205), the state is considered to be the case (1), (2), or (4) described above. As an example of the case (2) among these cases, the weather may get worse and get dark in the daytime, and the inverter 4 may stop. In this case, the solar radiation intensity may increase rapidly due to the recovery of the weather. However, even when the solar radiation intensity is recovered and the power generation becomes possible, no output current flows unless the inverter 4 is restarted. Accordingly, the CPU 51 determines whether or not a time required for starting the inverter 4 has elapsed (step S207). Specifically, in this process, the CPU 51 refers to the value of the inverter operation wait counter and determines whether or not this value exceeds a predetermined reference value. The time required for starting the inverter 4 is about 30 seconds to three minutes depending on the model. Therefore, when a value corresponding to three minutes is previously set to the above reference value, it is possible to cope with many types of power conditioners.

When the time required for starting the inverter 4 has not elapsed (NO in step S207), the CPU 51 sets the inverter operation wait flag (step S208) and ends the power generation state determination process.

Figure 12:
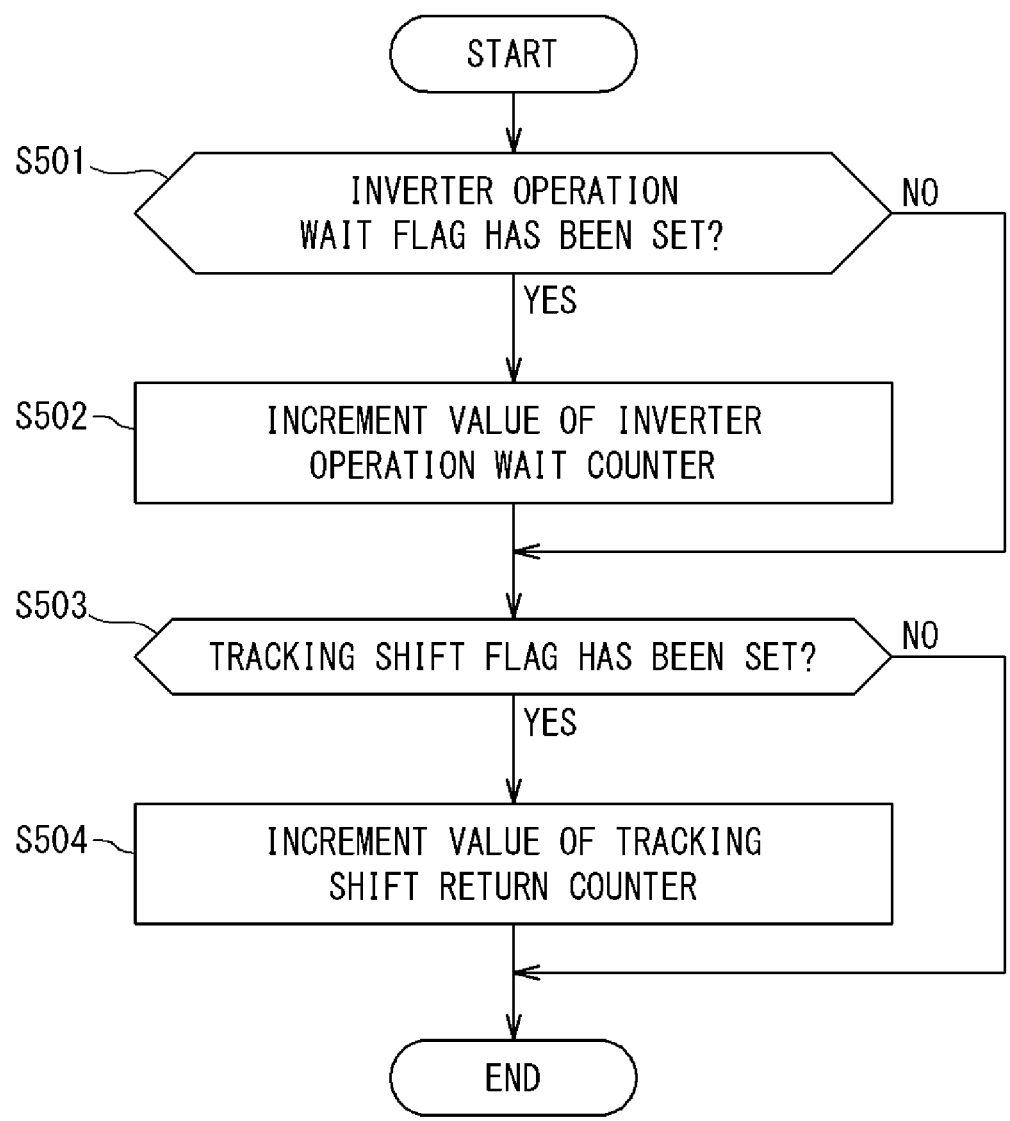
FIG. 12 is a flowchart showing an example of a counting process.

The CPU 51 repeatedly performs such a counting process as follows at predetermined time intervals (e.g., every 20 milliseconds). FIG. 12 is a flowchart showing an example of the counting process. The CPU 51 first determines whether or not the inverter operation wait flag has been set (step S501). When the inverter operation wait flag has been set (YES in step S501), the CPU 51 increments the value of the inverter operation wait counter by one (step S502) and proceeds the process to step S503. On the other hand, when the inverter operation wait flag has fallen (NO in step S501), the CPU 51 proceeds the process directly to step S503.

In step S503, the CPU 51 determines whether or not the tracking shift flag has been set. When the tracking shift flag has been set (YES in step S503), the CPU 51 increments the value of the tracking shift return counter by one (step S504) and ends the counting process. On the other hand, when the tracking shift flag has fallen (NO in step S503), the CPU 51 ends the counting process as it is.

Referring to FIG. 9, the description returns to the description of the power generation state determination process. When the inverter operation wait flag has been set, the counting process as described above is repeatedly performed at predetermined time intervals, so that the value of the inverter operation wait counter increases as time passes. Therefore, when the power generation state determination process is repeatedly performed, the process proceeds to "YES" in step S207 shown in FIG. 9 at the point when a time corresponding to the reference value has elapsed after the inverter operation wait flag is set. At this point, when there is no defect in the inverter 4, the start of the inverter 4 has been completed.

The CPU 51 turns on the switches SW1, SW2 to short-circuit the strings S1, S2 (step S209). Further, the CPU 51 reads the short-circuit current values of the strings S1, S2 which are the detection results of the current detection units A1, A2 (step S210). Thereafter, the CPU 51 turns off the switches SW1, SW2 to cancel the short circuit (step S211). The short-circuit time is, for example, several tens of milliseconds or more and several hundreds of milliseconds or less because the circuit is damaged when the short circuit is performed for a predetermined time or more.

The CPU 51 determines whether or not the short-circuit current is flowing (step S212). In this process, for example, when the short-circuit current values of both the strings S1, S2 exceed 0, it is determined that the short-circuit current is flowing, and when one of or both the short-circuit current values are 0, it is determined that no short-circuit current is flowing. In a case where there is one photovoltaic panel (module, string, or array) as a determination target for whether or not the short-circuit current is flowing, when the short-circuit current value of the photovoltaic panel is greater than 0, it may be determined that the short-circuit current is flowing, and when the short-circuit current value is 0, it may be determined that no short-circuit current is flowing. In a case where the number of photovoltaic panels as the determination targets is three or more, when the short-circuit current values of all the photovoltaic panels exceed 0, it may be determined that the short-circuit current is flowing, and when the short-circuit current value of at least one photovoltaic panel is 0, it may be determined that no short-circuit current is flowing.

At the point of step S212, with the process having proceeded to "YES" in step S205, the case (3) is excluded. Hence the strings S1, S2 are in a state where no defect has occurred, and when the converged light is hitting each cell 38, the power generation is performed, so that the short-circuit current flows. Therefore, when "YES" in step S212, the state is estimated to be the case (1) or (2), and when "NO", the state is estimated to be the case (4).

The case (1) or (2) is a state where the inverter 4 is not operating and the power generation is thus being unable to be performed. When the sun-tracking operation is continued in this state, there is a possibility that concentrated heat is generated and the cell 38 and its peripheral circuits are damaged. Accordingly, in the case of "YES" in step S212, the CPU 51 performs the variable set process (step S206). As a result, the tracking shift flag is set, and the sun-tracking shift operation is performed by the driving device 6. Therefore, damage due to concentrated heat in the cell 38 and its peripheral circuit can be prevented. After the variable set process, the CPU 51 ends the power generation state determination process.

In the case of (4), in the sun-tracking operation, for example, a state in which the array 1 shifts from the sun-tracking shift attitude or the refuge attitude to the attitude facing the sun, or some other state can be considered. Then, in the case of "NO" in step S212, the CPU 51 performs the variable reset process (step S203). As a result, the tracking shift flag falls, and the sun-tracking operation is continuously performed by the driving device 6. After the variable reset process, the CPU 51 ends the power generation state determination process.

When the sun-tracking operation is not being performed in step S201 (NO in step S201), the CPU 51 determines whether the sun-tracking shift operation is being performed (step S213). When the sun-tracking shift operation is not performed (NO in step S213), it can be determined that it is nighttime or the maintenance work is being performed, so that the CPU 51 ends the power generation state determination process.

When the sun-tracking shift operation is being performed (YES in step S213), as described in the case (2) above, the sun-tracking shift operation may be performed as a result of the stoppage of the inverter 4 due to the worsening of the daytime weather. In this case, there is a possibility that the solar radiation recovers and the state where the power generation is possible is restored. Accordingly, when a predetermined time (e.g., 1 hour) has elapsed after the start of the sun-tracking shift operation, it is estimated that the power generation state has been restored, and the CPU 51 switches from the sun-tracking shift operation to the sun-tracking operation. That is, in the case of "YES" in step S213, the CPU 51 performs the variable reset process (step S203). As a result, the tracking shift flag falls, the sun-tracking shift operation stops, and the sun-tracking operation is performed. After the variable reset process, the CPU 51 ends the power generation state determination process.

Other Examples

It is also possible to determine whether or not the photovoltaic panel is generating power by using the detection result of the output current without detecting the output voltage of the photovoltaic panel. For example, when the output current is flowing in one of the strings S1, S2 and is not flowing in the other string, it can be determined that the power generation is being performed in the string in which the output current is flowing and that the power generation is not being performed in the string in which no output current is flowing. When there is a string not generating power as thus described, the sun-tracking shift operation can be performed to prevent damage due to concentrated heat in the cell 38 and its peripheral circuit.

SUPPLEMENTARY NOTE

It is to be considered that the embodiment disclosed herein is merely illustrative and not restrictive in all aspects. The scope of the present invention is defined by the scope of the claims and is intended to include meaning equivalent to the scope of the claims and all modifications within the scope.

REFERENCE SIGNS LIST

1: ARRAY
1M: MODULE
2: SUPPORT DEVICE
4: POWER CONDITIONER
5: CONTROL UNIT
6: DRIVING DEVICE
11: MOUNTING BASE
12: REINFORCING MATERIAL
13: BOX
14: SOLAR RADIATION INTENSITY DETECTION MODULE
14a: SHORT CIRCUIT
21: POST
22: BASE
23: BIAXIAL AXIS DRIVE PART
23a, 23e: MOTOR
24: HORIZONTAL SHAFT
31: HOUSING
32: CONCENTRATING PORTION
32a: GLASS PLATE
32f: CONDENSER LENS
33: FLEXIBLE PRINTED CIRCUIT
34: CELL PACKAGE
35: SECONDARY LENS
36: PROTECTION PLATE
37: SHIELDING PLATE
37a: OPENING
38: CELL
39: RESIN
51: CPU
52: MEMORY
52a: CONTROL PROGRAM
53: A/D CONVERTER
54: SENSOR SUBSTRATE
100: PHOTOVOLTAIC APPARATUS
A1 to A3: CURRENT DETECTION UNIT
S1, S2: STRING
SW1, SW2: SWITCH
V1, V2: VOLTAGE DETECTION UNIT

The invention claimed is:

1. A photovoltaic apparatus comprising:
a concentrator photovoltaic panel including a power generating circuit including a power generating element;
a driving device configured to change an angle of the concentrator photovoltaic panel;
a current sensor configured to detect an output current of the concentrator photovoltaic panel;
a hardware processor programmed to perform operations to control the driving device; and
a solar radiation intensity sensor attached to the concentrator photovoltaic panel, the solar radiation intensity sensor having a light receiving surface parallel to the concentrator photovoltaic panel, wherein
the operations include, when a solar radiation intensity detected by the solar radiation intensity sensor is equal to or greater than a threshold value, the threshold value corresponding to a value with which power generation is possible, and the output current of the concentrator photovoltaic panel detected by the current sensor is zero, causing the driving device to change the angle of the concentrator photovoltaic panel to an attitude not facing the sun.

2. The photovoltaic apparatus according to claim 1, further comprising
a voltage sensor configured to detect an output voltage of the concentrator photovoltaic panel, wherein
when the solar radiation intensity detected by the solar radiation intensity sensor is equal to or greater than the threshold value, the output current of the concentrator photovoltaic panel detected by the current sensor is zero, and the output voltage of the concentrator photovoltaic panel detected by the voltage sensor is zero, the hardware processor is programmed to cause the driving device to change the angle of the concentrator photovoltaic panel to the attitude not facing the sun.

3. The photovoltaic apparatus according to claim 1, wherein
the solar radiation intensity sensor includes a short-circuit current detection unit configured to detect a short-circuit current of the concentrator photovoltaic panel.

4. The photovoltaic apparatus according to claim 1, further comprising
a switch configured to short-circuit the concentrator photovoltaic panel, wherein
the solar radiation intensity sensor detects a short-circuit current of the concentrator photovoltaic panel as a detection value of the solar radiation intensity when the concentrator photovoltaic panel is short-circuited by the switch.

* * * * *